(12) United States Patent  (10) Patent No.: US 8,120,987 B2
Pilo et al.  (45) Date of Patent: Feb. 21, 2012

(54) STRUCTURE AND METHOD FOR DECODING READ DATA-BUS WITH COLUMN-STEERING REDUNDANCY

(75) Inventors: Howard Pilo, Underhill, VT (US); Vinod Ramadurai, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 12/652,345

(22) Filed: Jan. 5, 2010

(65) Prior Publication Data

US 2011/0164463 A1   Jul. 7, 2011

(51) Int. Cl.
    *G11C 8/00* (2006.01)
(52) U.S. Cl. .............. 365/230.06; 365/200; 365/207
(58) Field of Classification Search ............. 365/230.06, 365/200, 207
    See application file for complete search history.

(56) References Cited

U.S. PATENT DOCUMENTS

| 5,265,050 | A   |   | 11/1993 | McLaury |
| 6,366,526 | B2  | * | 4/2002  | Naffziger et al. ........ 365/230.06 |
| 6,542,973 | B2  |   | 4/2003  | Hsu et al. |
| 7,145,817 | B2  |   | 12/2006 | Mohr et al. |
| 7,340,668 | B2  |   | 3/2008  | Klein |

* cited by examiner

*Primary Examiner* — Son Dinh
*Assistant Examiner* — Nam Nguyen
(74) *Attorney, Agent, or Firm* — David A. Cain

(57) ABSTRACT

A random access memory circuit enabling a decodable sense amplifier array for power saving with column steering redundancy. A first decoder receives an input address and accesses at least one memory cell in the array and is capable of executing column steering redundancy. A master redundancy signal is triggered when column steering redundancy is requested. A plurality of sense amplifiers, wherein, each sense amplifier in the plurality of sense amplifiers is coupled to at least one memory cell in an array of memory cells. A second decoder receives the input address and selectively activates a first set of sense amplifiers of the plurality of sense amplifiers and selectively activates a second set of sense amplifiers in the plurality of amplifier only when the master redundancy signal is activated.

15 Claims, 2 Drawing Sheets

STRUCTURE AND METHOD FOR DECODING READ DATA-BUS WITH COLUMN-STEERING REDUNDANCY

FIELD OF THE INVENTION

The present invention relates to static random access memories ("SRAMs"), and more particularly to arrays of SRAMs with column redundancy decoded onto a data-bus in a manner that allows for power savings during read cycles.

BACKGROUND

The present invention relates to static random access memories ("SRAMs"), and more particularly to arrays of SRAMs with column redundancy decoded onto a data-bus in a manner that allows for power savings during read cycles.

A basic SRAM cell includes a balanced pair of cross-coupled inverters storing a single data bit with a high at the output of one inverter and a low at the output of the other inverter. A pair of pass gates selectively connects the complementary outputs of the cross-coupled inverters to a corresponding complementary pair of bit lines. A word line connected to the pass gates selects the cell, connecting the cell contents to the corresponding complementary pair of bit lines.

SRAM cells are arranged in an SRAM array. Wordlines run in a direction of rows across an SRAM array. Bitlines run in a direction of columns across the SRAM array. Typically, one wordline is connected to each cell of a row of cells in the SRAM array. Typically, two bitlines carrying complementary signals are connected to each cell in a column of cells in the SRAM array. One of the complementary bitlines carries a "true" signal, representing the actual state of a bit signal, and the other bitline carries a "complementary" signal representing an inverted version of the bit signal.

A N-by-M SRAM array is organized as N rows of wordlines by M columns of bit line pairs. Accessing a K bit single word from the array entails driving one of the N word lines. During a read operation, each cell on the selected word line couples its contents to its corresponding bit line pair through the pass gates. Each cell on a selected column line may be coupled to a simple sense amplifier ("sense amp"). Since the bitline pair is typically precharged to some common voltage, initially, the internal low voltage rises until one of the bitline pairs drops sufficiently to develop a small difference signal on the bit line pair and the SA is triggered by a set signal to drive the BL to the desired state. The set signal controls one or more BLs.

SRAM macros are generally accessed using addresses. These addresses are employed to activate certain wordlines, which allow conductivity between activated or deactivated cells within subarrays and bitlines coupled thereto. Conventional decoders typically include an initial decode stage (or "predecode" state), as well as a final decode stage where the decoded addresses are used to activate selected wordlines to generate date from the memory macro.

Conventional SRAM arrays contain a greater number of BLs than the number of bits on the data bus they are connected to. Therefore, the BLs are decoded onto the data bus based on the address. Essentially only certain BLs are needed when accessing the data bus and the other BLs are not used.

Conventionally, BLs that are not decoded onto the data bus are still activated even though they are not used. The unused but activated BLs still consume power. A solution to this problem is to reduce the power consumption by decoding the address and only activating the SAs of the BLs which will be decoded onto the data bus. Therefore, if the data bus is one quarter the size of the number of BLs, only one quarter of the BLs will be activated when the data bus is accessed.

However, this approach does not work when the SRAM array contains column steering redundancy. Column steering redundancy allows for a column to be replaced by shifting all columns higher than the failing column down by one spot on the address and shifting in a redundant column to the position of the highest column. Traditional power saving with decoding of the BLs does not work when column steering redundancy is activated because it cannot account for the shift of the columns and not all proper BLs would be activated when the data bus is activated.

SUMMARY

One embodiment of the invention is summarized as follows. A random access memory circuit comprises an array of memory cells and an array of global bit lines. A first decoder is coupled to the array of memory cells and is configurable for receiving an input address and for accessing at least one memory cell in the array of memory cells in response thereto. The first decoder is capable of executing column steering redundancy within the array of memory cells. An output bus is selectively driven by a subset of global bit lines in the array of global bit lines based on the input address. A master redundancy signal is activated if column steering redundancy is executed. Each sense amplifier in a plurality of sense amplifiers is coupled to at least one memory cell in the array of memory cells. Each sense amplifier drives one of the global bit lines in the array of global bit lines. Each sense amplifier is configurable for determining a logical state of the memory cells to which it is coupled. A second decoder is coupled to the plurality of sense amplifiers. The second decoder receives the input address, selectively activates a first set of sense amplifiers of the plurality of sense amplifiers, and selectively activates a second set of sense amplifiers in the plurality of amplifier only when the master redundancy signal is activated.

Another embodiment of the invention is summarized as follows. A random access memory circuit comprises an array of memory cells arranged in a plurality of rows and a plurality of columns. Each word line in a plurality of word lines is coupled to one of the plurality of rows. Each bit line in a plurality of bit lines is coupled to one of the plurality of columns. Each sense amplifier in a plurality of sense amplifiers is coupled to one of the plurality of bit lines for determining a logical state of the one of the plurality of bit lines. An address bus references a specified section of the array of memory cells. A word line decoder decodes the address bus and activates the addressed row of memory cells on the plurality of bit lines. A master redundancy signal is activated if column steering redundancy is requested. A bit line decoder decodes the address bus. The bit line decoder activates a first section of the plurality of sense amplifiers which is coupled to the addressed columns of memory cells on the plurality of bit lines. The bit line decoder drives a data bus with the bit lines which are coupled to the addressed columns. The bit line decoder can execute column steering redundancy by shifting which bit lines drive the data bus to replace a failing bit line. The bit line decoder activates a second section of the plurality of sense amplifiers which is coupled to the columns of the memory cells adjacent to the addressed columns of the memory cells on the plurality of bit lines only when the master redundancy signal is activated.

Another embodiment of the invention is summarized as a method of decoding a random access memory circuit onto a data bus. The random access memory circuit comprises an array of memory cells arranged in a plurality of rows and a plurality of columns. Each word line in a plurality of word lines is coupled to one of the plurality of rows. Each bit line in a plurality of bit lines is coupled to one of the plurality of columns. Each sense amplifier in a plurality of sense amplifiers is coupled to one of the plurality of bit lines for determining a logical state of the one of the plurality of bit lines. The data bus is smaller than the number of bit lines. An address bus selects which bit lines will be connected to the data bus. The bit lines can be shifted to replace a failing column. A master redundancy signal is activated when the bit lines are shifted to replace a failing column. The address bus is decoded to only activate those sense amplifiers coupled to the bit lines that will be connected to the data bus. The address bus is decoded to activate the sense amplifiers adjacent to the sense amplifiers coupled to the bit lines that will be connected to the data bus when the master redundancy signal is activated.

BRIEF DESCRIPTION OF THE DRAWINGS

These and other features of this invention will be more readily understood from the following detailed description of the various aspects of the invention taken in conjunction with the accompanying drawings.

DETAILED DESCRIPTION

The present invention provides a SRAM array structure with decoded sense amplifiers and column steering redundancy. The sense amplifier arrays of the SRAM cells are selectively enabled to reduce power consumption in the SRAM array. The structure provides for redundancy within the SRAM array which accounts for the decoding of the sense amplifiers.

Figure 1:
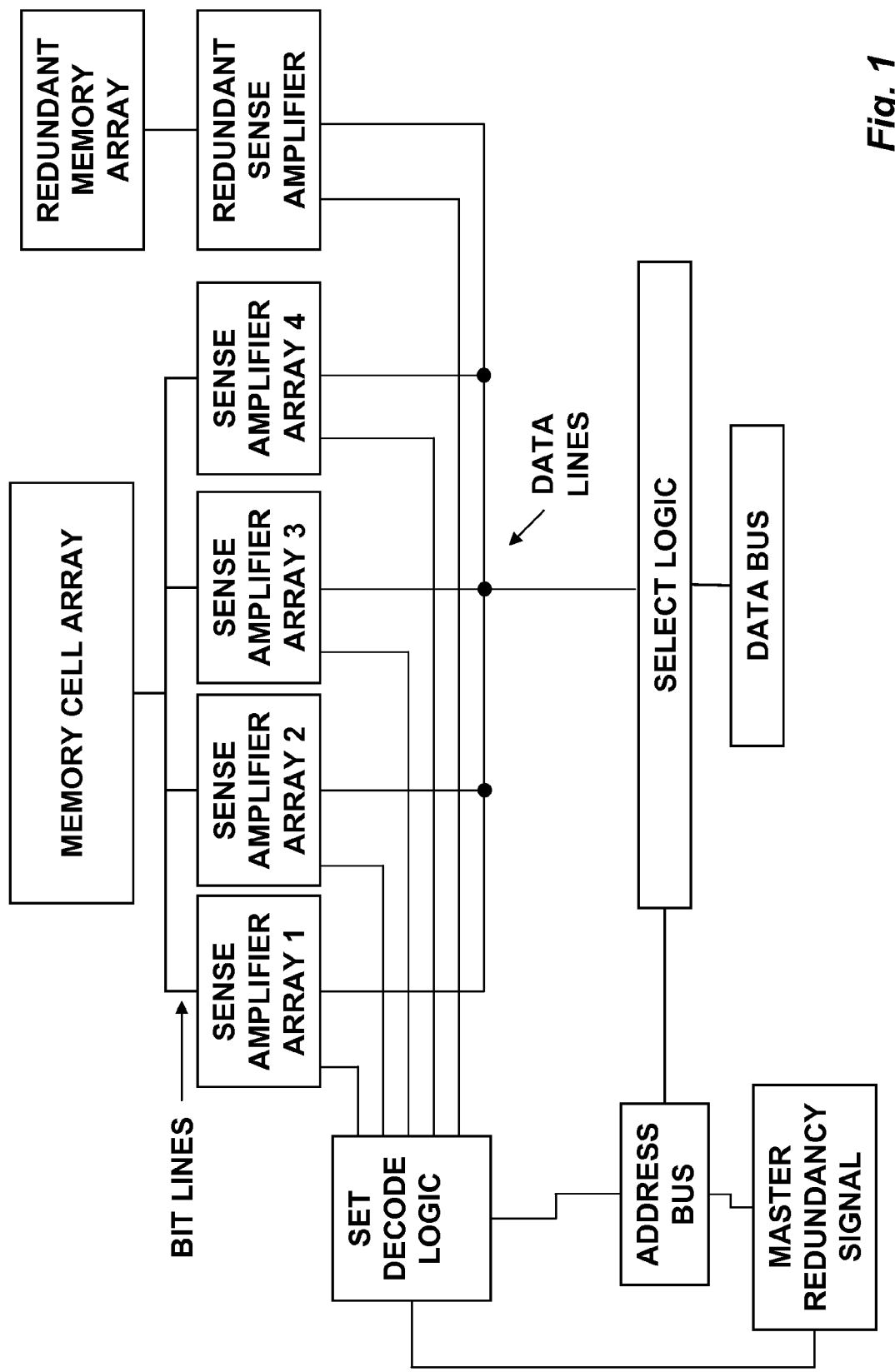
FIG. 1 depicts a random access memory circuit having column steering redundancy with decoded set signals for power savings in accordance with an embodiment of the present invention.
Figure 2:
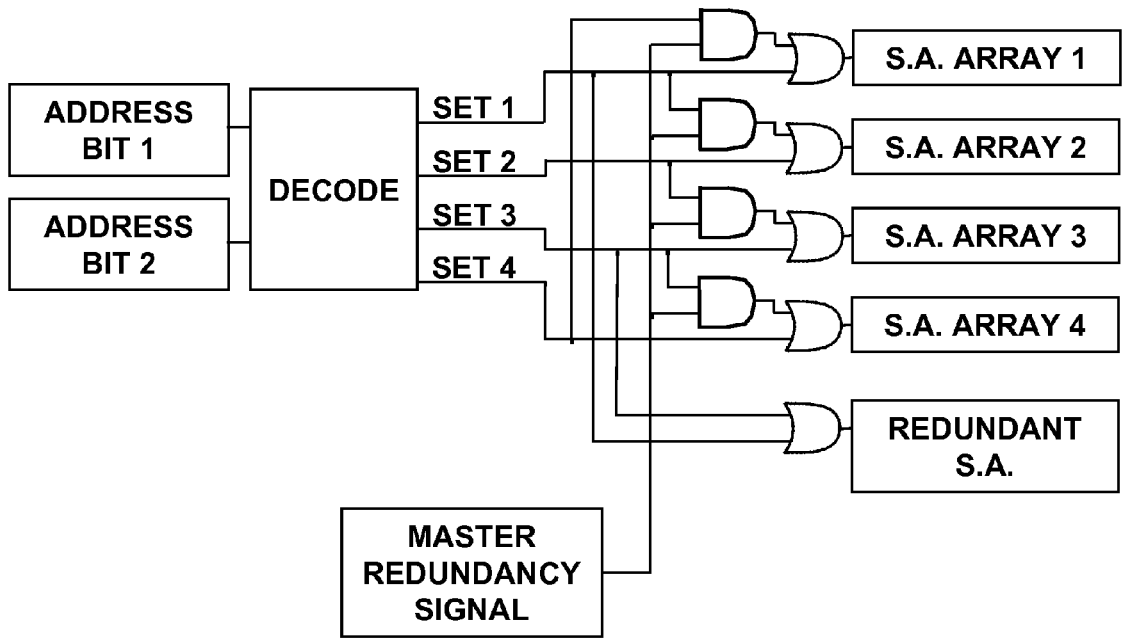
FIG. 2 depicts decode logic for a random access memory circuit having column steering redundancy with decoded set signals for power savings in accordance with an embodiment of the present invention.

An embodiment of the invention is shown in FIG. 2, an SRAM array structure. The bit lines are arranged in groups with each group being connected to a respective sense amplifier. Only one array of sense amplifiers will be activated based on an input memory address. The activated array of sense amplifiers will drive the signal from the address selected bit lines through select logic, onto a data bus.

The SRAM array also comprises a redundant memory array which connects to one of the sense amplifier arrays. The structure uses column steering redundancy, therefore if one of the local bit lines fail all higher bit lines can be shifted down to take the place of the failing bit line and a bit line connected to the redundant memory array is shifted into the highest bit line position.

The SRAM array also comprises set decode logic which selectively activates one of the sense amplifier arrays. The set decode logic takes as inputs the selected address present on the address bus and a master redundancy signal. The master redundancy signal will be activated when column steering redundancy is selected. The set decode logic outputs a set line for each sense amplifier array which will activate the sense amplifiers in that sense amplifier array. When activated the sense amplifier arrays will drive the address selected subset of bit lines in to the select logic, which then connects the address selected subset of bit lines onto the data bus.

Generally, the sense amplifier arrays will arranged so that adjacent bit lines (physically adjacent and adjacent with respect to address) will not be connected to the same sense amplifier array. Every Nth bit line will be connected to sense amplifiers of the same array, where N is the number of sense amplifier arrays. Therefore, if there are four sense amplifier arrays, every forth bit line will be connected to the same sense amplifier array.

By using the address from the address bus, the decoder only activates the sense amplifier array connected to the selected subset of bit lines. Therefore, only those sense amplifiers connected to the one activated set line is enabled and less power is consumed because not all sense amplifiers are activated.

FIG. 3 shows one embodiment of the set decode logic. When four sense amplifiers arrays ("S.A. Array") are being selectively activated, two bits of the selected address from the address bus can go through a simple decode to activate one of the four set lines ("Set 1" through "Set 4"). A master redundancy signal input is set high when column-steering redundancy is enabled. Each set line is separately anded with the master redundancy signal, with the resulting signal connecting being ored with an adjacent set line and the resulting signal activating the sense amplifier arrays. Therefore, the sense amplifier is activated when its respective set line is high or when the adjacent set line is high and the redundancy signal is high.

The invention therefore activates extra sense amplifier arrays when column-steering redundancy is enabled, consuming more power than when column-steering redundancy is not enabled but still less than activating all sense amplifier arrays.

An embodiment of the invention uses two activate inputs for each sense amplifier in the sense amplifier arrays. Each of the two activate inputs has a different set line from the set decode logic connected to it, however one of the set lines is anded with the master redundancy signal.

The invention claimed is:
1. A random access memory circuit comprising:
an array of memory cells;
an array of global bit lines;
a first decoder coupled to the array of memory cells, the first decoder being configurable for receiving an input address and for accessing at least one memory cell in the array of memory cells in response thereto, wherein the first decoder is capable of executing column steering redundancy within the array of memory cells;
an output bus which is selectively driven by a subset of global bit lines in the array of global bit lines based on the input address;
a master redundancy signal which is activated if column steering redundancy is executed;
a plurality of sense amplifiers, wherein,
    each sense amplifier in the plurality of sense amplifiers is coupled to at least one memory cell in the array of memory cells;
    each sense amplifier drives one of the global bit lines in the array of global bit lines; and
    each sense amplifier is configurable for determining a logical state of the memory cells to which it is coupled;
a second decoder coupled to the plurality of sense amplifiers, wherein,
    the second decoder receives the input address;

the second decoder selectively activates a first set of sense amplifiers of the plurality of sense amplifiers; and the second decoder selectively activates a second set of sense amplifiers in the plurality of amplifier only when the master redundancy signal is activated.

2. A random access memory circuit of claim 1, wherein, the second set of sense amplifiers activated by the second decoder when the master redundancy signal is activated are adjacent to the first set of sense amplifiers.

3. A random access memory circuit of claim 1, wherein, each of the sense amplifiers in the plurality of sense amplifier has two input signals that activate the sense amplifier, wherein, one of the two input signals is only activated when the master redundancy signal is activated.

4. A random access memory circuit of claim 1, wherein, each of the sense amplifiers in the plurality of amplifiers is activated by the output of an or gate, wherein, the inputs to the or gate are coupled to the second decoder and the master redundancy signal.

5. A random access memory circuit of claim 1, wherein, the second decoder outputs an array of set signals;
each respective set signals in the array of set signals is coupled to a respective first group of sense amplifiers in the plurality of sense amplifiers, wherein the respective first group of sense amplifiers are activated by the respective set signal;
each respective set signal is logically combined with the master redundancy signal to output a respective redundant set signal; and
each respective redundant set signal is coupled to a respective second group of sense amplifiers in the plurality of sense amplifiers, wherein the respective second group of sense amplifiers can be activated by the respective redundancy set signal.

6. A random access memory circuit of claim 1, wherein, the first set of sense amplifiers which are selectively activated by the second decoder are coupled to the subset of global bit lines driving the output bus.

7. A random access memory circuit of claim 6, wherein, the second set of sense amplifiers which are selectively activated by the second decoder only when the master redundancy signal is activated are coupled to the subset of global bit lines adjacent to the subset of global bit lines driving the output bus.

8. A random access memory circuit comprising:
an array of memory cells arranged in a plurality of rows and a plurality of columns;
a plurality of word lines, wherein each word line is coupled to one of the plurality of rows;
a plurality of bit lines, wherein each bit line is coupled to one of the plurality of columns;
a plurality of sense amplifiers, wherein each sense amplifier is coupled to one of the plurality of bit lines for determining a logical state of the one of the plurality of bit lines;
an address bus, wherein the address bus references a specified section of the array of memory cells;
a word line decoder, wherein the word line decoder decodes the address bus and activates the addressed row of memory cells on the plurality of bit lines;
a master redundancy signal which is activated if column steering redundancy is requested; and
a bit line decoder, wherein,
the bit line decoder decodes the address bus;
the bit line decoder activates a first section of the plurality of sense amplifiers which is coupled to the addressed columns of memory cells on the plurality of bit lines;
the bit line decoder drives a data bus with the bit lines which are coupled to the addressed columns;
the bit line decoder can execute column steering redundancy by shifting which bit lines drive the data bus to replace a failing bit line; and
the bit line decoder activates a second section of the plurality of sense amplifiers which is coupled to the columns of the memory cells adjacent to the addressed columns of the memory cells on the plurality of bit lines only when the master redundancy signal is activated.

9. A random access memory circuit of claim 8, wherein, each of the sense amplifiers in the plurality of sense amplifier has two input signals that activate the sense amplifier, wherein, one of the two input signals is only activated when the master redundancy signal is activated.

10. A random access memory circuit of claim 8, wherein, each of the sense amplifiers in the plurality of amplifiers is activated by the output of an or gate, wherein, the inputs to the or gate are coupled to the bit line decoder and the master redundancy signal.

11. A random access memory circuit of claim 8, wherein, the bit line decoder outputs an array of set signals;
each respective set signals in the array of set signals is coupled to a respective first group of sense amplifiers in the plurality of sense amplifiers, wherein the respective first group of sense amplifiers are activated by the respective set signal;
each respective set signal is logically combined with the master redundancy signal to output a respective redundant set signal; and
each respective redundant set signal is coupled to a respective second group of sense amplifiers in the plurality of sense amplifiers, wherein the respective second group of sense amplifiers can be activated by the respective redundancy set signal.

12. A method of decoding a random access memory circuit onto a data bus, wherein the random access memory circuit consists of:
an array of memory cells arranged in a plurality of rows and a plurality of columns;
a plurality of word lines, wherein each word line is coupled to one of the plurality of rows;
a plurality of bit lines, wherein each bit line is coupled to one of the plurality of columns;
a plurality of sense amplifiers, wherein each sense amplifier is coupled to one of the plurality of bit lines for determining a logical state of the one of the plurality of bit lines;
wherein the data bus is smaller than the number of bit lines;
wherein an address bus selects which bit lines will be connected to the data bus;
wherein the bit lines can be shifted to replace a failing column;
wherein a master redundancy signal is activated when the bit lines are shifted to replace a failing column;
wherein the address bus is decoded to only activate those sense amplifiers coupled to the bit lines that will be connected to the data bus; and
wherein the address bus is decoded to activate the sense amplifiers adjacent to the sense amplifiers coupled to the bit lines that will be connected to the data bus when the master redundancy signal is activated.

13. A random access memory circuit of claim 12, wherein, each of the sense amplifiers in the plurality of sense amplifier has two input signals that activate the sense amplifier, wherein, one of the two input signals is only activated when the master redundancy signal is activated.

14. A random access memory circuit of claim 12, wherein, each of the sense amplifiers in the plurality of amplifiers is activated by the logical combination of the address bus and the master redundancy signal.

15. A random access memory circuit of claim 12, wherein, an array of set signals are dependant on the address bus; each respective set signals in the array of set signals controls a respective first group of sense amplifiers in the plurality of sense amplifiers;

each respective set signal is logically combined with the master redundancy signal to output a respective redundant set signal; and each respective redundant set signal controls a respective second group of sense amplifiers in the plurality of sense amplifiers.

* * * * *

UNITED STATES PATENT AND TRADEMARK OFFICE
CERTIFICATE OF CORRECTION

| | | |
|---|---|---|
| PATENT NO. | : 8,120,987 B2 | Page 1 of 1 |
| APPLICATION NO. | : 12/652345 | |
| DATED | : February 21, 2012 | |
| INVENTOR(S) | : Harold Pilo and Vinod Ramadurai | |

It is certified that error appears in the above-identified patent and that said Letters Patent is hereby corrected as shown below:

Title Page, Item 75: The first name of one of the inventors is incorrect. Should be Harold Pilo, not Howard.

Signed and Sealed this
Eighth Day of May, 2012

David J. Kappos
*Director of the United States Patent and Trademark Office*